United States Patent [19]
Okada

[11] 4,401,899
[45] Aug. 30, 1983

[54] CURRENT COMPARATOR CIRCUIT

[75] Inventor: Takashi Okada, Yokohama, Japan

[73] Assignee: Sony Corporation, Tokyo, Japan

[21] Appl. No.: 213,366

[22] Filed: Dec. 5, 1980

Related U.S. Application Data

[63] Continuation of Ser. No. 966,661, Dec. 5, 1978, abandoned.

[30] Foreign Application Priority Data

Dec. 28, 1977 [JP] Japan ............... 52-160608

[51] Int. Cl.³ ............... H03K 5/153; H03K 13/175
[52] U.S. Cl. ............... 307/350; 307/361; 307/363; 328/147; 328/150
[58] Field of Search ............... 307/350, 354, 360, 361, 307/363, 358; 328/135, 147, 150

[56] References Cited

U.S. PATENT DOCUMENTS 3,138,760  6/1964  Gilbert ............... 307/361

Primary Examiner—John Zazworsky
Attorney, Agent, or Firm—Hill, Van Santen, Steadman, Chiara & Simpson

[57] ABSTRACT

A current comparator circuit is composed of an input signal current source, plural pairs each consisting of a diode and reference current source, and plural switching elements. The pairs each consisting of a diode and reference current source are connected in series or in parallel to the input signal current source. Each switching element is a transistor, which is connected to the connection point between the paired diode and reference current source, and a compared output can be obtained from the collector of the transistor.

5 Claims, 20 Drawing Figures

CURRENT COMPARATOR CIRCUIT

This is a continuation, of application Ser. No. 966,661, filed Dec. 5, 1978 now abandoned.

BACKGROUND OF THE INVENTION

The present invention relates mainly to a current comparator circuit suitable for use in various types of electronic apparatus, and particularly to a current comparator circuit capable of low power or low voltage driving.

Comparator circuits which have been used in various kinds of electronic apparatus perform a comparison mostly on the basis of voltage, in which voltage $V_S$ of a supplied input signal is compared with a reference voltage to obtain some detected voltage. In such a comparator circuit as to make a comparison on the basis of voltage, a power source voltage for obtaining the reference voltage requires something in addition to the voltage $V_S$ of the input signal. As a result, when the voltage $V_S$ of the input signal is large, the source voltage should be made high resulting in the increase of electric power. Therefore, there is a limit to low power or low voltage driving and high frequency driving.

SUMMARY OF THE INVENTION

It is an object of this invention to provide a current comparator circuit free from the above drawbacks with a simplified construction.

It is another object of this invention to provide a current comparator circuit which is suitable for low power or low voltage driving and high frequency driving.

According to the feature of this invention, a current comparator circuit is provided which includes an input signal current source, plural pairs each consisting of a diode and reference current source, and a plurality of transistors. In this circuit, each pair of diode and reference current source is connected to the input signal current source, and each transistor is connected to the connection point between the paired diode and reference current source so that a compared output can be obtained from the collector of the transistor.

The other objects, features and advantages of this invention will be apparent from the following description taken in conjunction with the accompanying drawings.

DESCRIPTION OF THE PREFERRED EMBODIMENTS

One embodiment of a current comparator circuit of this invention will hereinafter be described with reference to FIG. 1.

Figure 1:
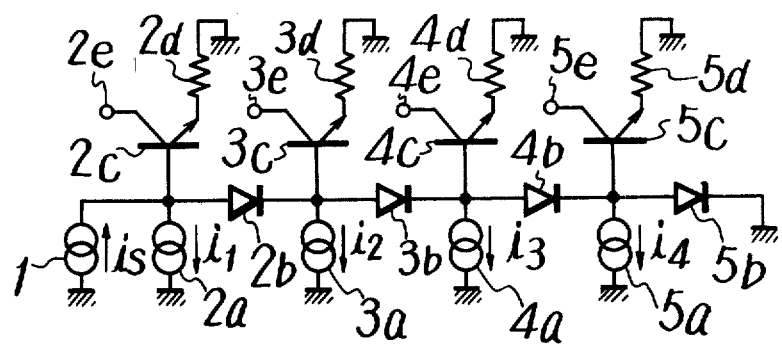
FIG. 1 is a connection diagram showing one embodiment of a current comparator circuit according to this invention.

In a circuit of FIG. 1, an input signal current source 1 is provided with one end thereof being grounded. The other end of the input signal current source 1 is also grounded through a constant current source 2a of current $i_1$ and also connected to the anode of a diode 2b. The cathode of the diode 2b is grounded through a constant current source 3a of current $i_2$ and also connected to the anode of a diode 3b. Similarly, the cathode of the diode 3b is grounded through a constant current source 4a of current $i_3$ and also connected to the anode of a diode 4b. The cathode of this diode 4b is then grounded through a constant current source 5a of current $i_4$ and also connected to the anode of a diode 5b, the cathode of which is grounded. The connection point between constant current source 2a and diode 2b, the connection point between constant current source 3a and diode 3b, the connection point between constant current source 4a and diode 4b, and the connection point between constant current source 5a and diode 5b are respectively connected to the bases of npn-type transistors 2c, 3c, 4c and 5c, each forming a detector circuit. The emitters of these transistors 2c, 3c, 4c and 5c are grounded through resistors 2d, 3d, 4d and 5d, respectively, and the collectors thereof are connected to output terminals 2e, 3e, 4e and 5e, respectively. Reference currents $i_1$, $i_2$, $i_3$ and $i_4$ are respectively determined arbitrarily in accordance with detected currents. By way of example, these currents $i_1$, $i_2$, $i_3$ and $i_4$ can be selected to be the same in value.

Figure 2A:
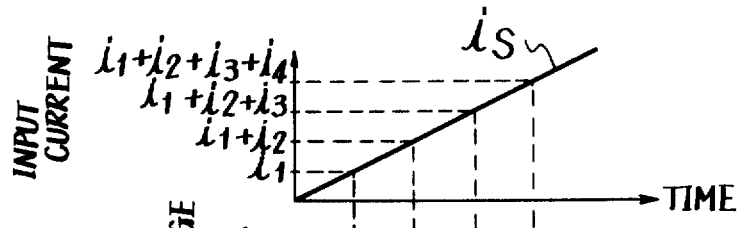
FIGS. 2A through 2E are graphs used for explaining this invention.
Figure 2B:
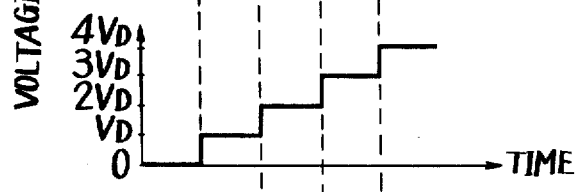
Figure 2C:
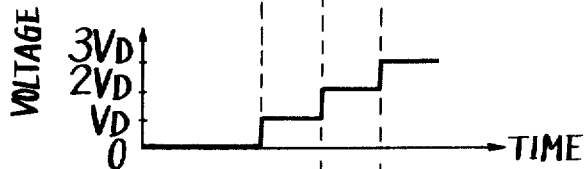
Figure 2D:
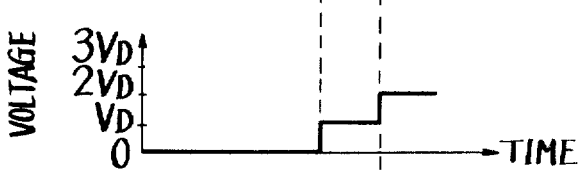
Figure 2E:
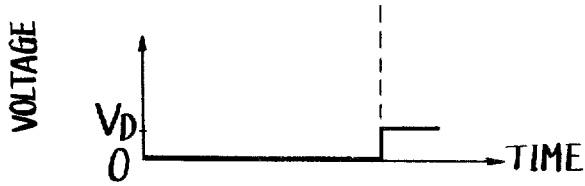

With the above mentioned circuit arrangement of this invention, when a current $i_S$, which increases with the lapse of time as shown in FIG. 2A, is supplied from the input signal current source 1, the base potentials of transistors 2c, 3c, 4c and 5c are varied as shown in FIGS. 2B, 2C, 2D and 2E, respectively, wherein $V_D$ represents a forward drop voltage across each diode. When the input current $i_S$ is smaller than $i_1$, the current $i_S$ is all absorbed into the constant current source 2a so that the base potential of transistor 2c becomes zero to make the same nonconductive or OFF. In this case, the other transistors 3c, 4c and 5c are also all nonconductive because the bases thereof are applied with no voltage. Next, when the input current $i_S$ is increased and once exceeds the current $i_1$, the current overflows and the overflowed current $(i_S - i_1)$ flows through the diode 2b to the constant current source 3a. The potential at the connection point between the cathode of diode 2b and the constant current source 3a is clamped at zero potential, so that the base potential of the transistor 2c is clamped to the voltage $V_D$ thereby to make the transistor 2c conductive or ON. When the current $(i_S - i_1)$ is smaller than the current $i_2$, this current is all absorbed into the constant current source 3a so that the base voltage of transistor 3c keeps zero to make it OFF. The transistors 4c and 5c are also supplied with no voltage so that they are nonconductive. Next, when the current $(i_S - i_1)$ exceeds the current $i_2$, the current overflows and this overflowed current $(i_S - i_1 - i_2)$ flows through the diode 3b to the constant current source 4a. The potential at the connection point between the cathode of diode 3b and the constant current source 4a is clamped to zero potential, so that the base potential of transistor $2c$ is clamped to $2V_D$ as shown in FIG. 2B and also the base potential of transistor $3c$ is clamped to $V_D$ as shown in FIG. 2C with the result that the transistors $2c$ and $3c$ are turned ON. When the current $(i_S-i_1-i_2)$ is smaller than the current $i_3$, this current is all absorbed into the constant current source $4a$ so that the base potential of transistor $4c$ becomes zero to make it nonconductive. The transistor $5c$ is also nonconductive because no voltage is applied thereto. Next, when the current $(i_S-i_1-i_2)$ exceeds the current $i_3$, the current overflows and the overflowed current $(i_S-i_1-i_2-i_3)$ flows through the diode $4b$ to the constant current source $5a$. The potential at the connection point between the cathode of diode $4b$ and the constant current source $5a$ is clamped to zero potential, so that the base potentials of transistors $2c$, $3c$ and $4c$ are respectively clamped to $3V_D$, $2V_D$ and $V_D$, as shown in FIGS. 2B, 2C and 2D to make them conductive. When the current $(i_S-i_1-i_2-i_3)$ is smaller than the current $i_4$, this current is all absorbed into the constant current source $5a$ so that the base potential of transistor $5c$ becomes zero to make it nonconductive. Next, when the current $(i_S-i_1-i_2-i_3)$ exceeds the current $i_4$, the current overflows and this overflowed current $(i_S-i_1-i_2-i_3-i_4)$ flows through the diode $5b$ to the ground. In this case, since the cathode potential of diode $5b$ is zero, the base potentials of transistors $2c$, $3c$, $4c$ and $5c$ are respectively clamped to $4V_D$, $3V_D$, $2V_D$ and $V_D$ as shown in FIGS. 2B, 2C, 2D and 2E to make these transistors conductive. Accordingly, the value of input signal current $i_S$ can be detected by the ON and OFF condition of the transistors $2c$, $3c$, $4c$ and $5c$.

As described above, according to this invention, the input signal current $i_S$ is detected with the maximum input signal current being divided into a plurality of reference currents $(i_1+i_2+i_3+i_4)$. Therefore, even though the input signal current $i_S$ is large, only a small source voltage, such as several $V_D$, is necessary for producing the reference currents. As a result, low power or low voltage driving and high frequency driving can be achieved.

Figure 3:
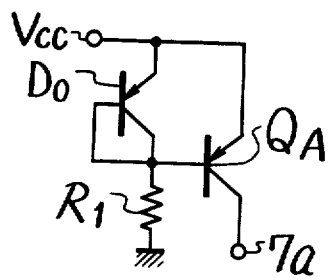
FIGS. 3 to 9, inclusive, are connection diagrams each showing an example of a constant current source used in this invention.

As the constant current sources $2a$, $3a$, $4a$ and $5a$ in FIG. 1, there can be used those as shown in FIGS. 3 to 9, inclusive. In the example of FIG. 3, the emitter of a diode-connected pnp-type transistor $D_0$ is connected to a DC voltage source terminal $V_{CC}$, while the collector-base connecting point of the transistor $D_0$ is grounded through a resistor $R_1$ and also connected to the base of a pnp-type transistor $Q_A$. The emitter of transistor $Q_A$ is connected to the voltage source terminal $V_{CC}$ and the collector thereof is connected to an output terminal $7a$. Thus, a current mirror circuit is formed by the diode-connected transistor $D_0$, the resistor $R_1$ and the transistor $Q_A$. In this case, if a current amplification factor according to the transistors $D_0$ and $Q_A$ is taken as 1, and also a resistance value of the resistor $R_1$ and a positive DC voltage applied to the terminal $V_{CC}$ are respectively taken as $R_1$ and $V_{CC}$ for the sake of convenience, a constant current $I_R$ is given as follows:

$$I_R = \frac{1}{R_1}(V_{CC} - V_{BE})$$

where $V_{BE}$ is the base-emitter voltage of transistor $Q_A$.

Figure 4:
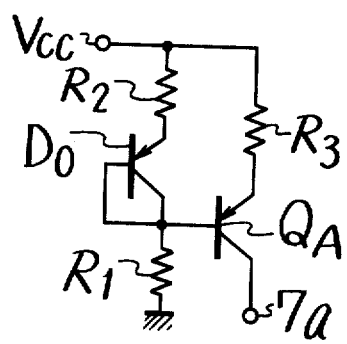

In the example of FIG. 4, the emitter of diode-connected pnp-type transistor $D_0$ is connected through a resistor $R_2$ to the voltage source terminal $V_{CC}$, while the collector-base connecting point of transistor $D_0$ is grounded through the resistor $R_1$ and also connected to the base of pnp-type transistor $Q_A$. The emitter of transistor $Q_A$ is connected through a resistor $R_3$ to the voltage source terminal $V_{CC}$ and the collector thereof is connected to the output terminal $7a$. This circuit is formed by the circuit of FIG. 3 with resistors $R_2$ and $R_3$ being added thereto. In the same manner as the example of FIG. 3, the constant current $I_R$ in the circuit of FIG. 4 is given as follows:

$$I_R = \frac{R_2}{R_1} \cdot \frac{1}{R_1 + R_2}(V_{CC} - V_{BE})$$

where $R_2$ and $R_3$ similarly represent the resistance value of resistors $R_2$ and $R_3$ for the sake of convenience.

Figure 5:
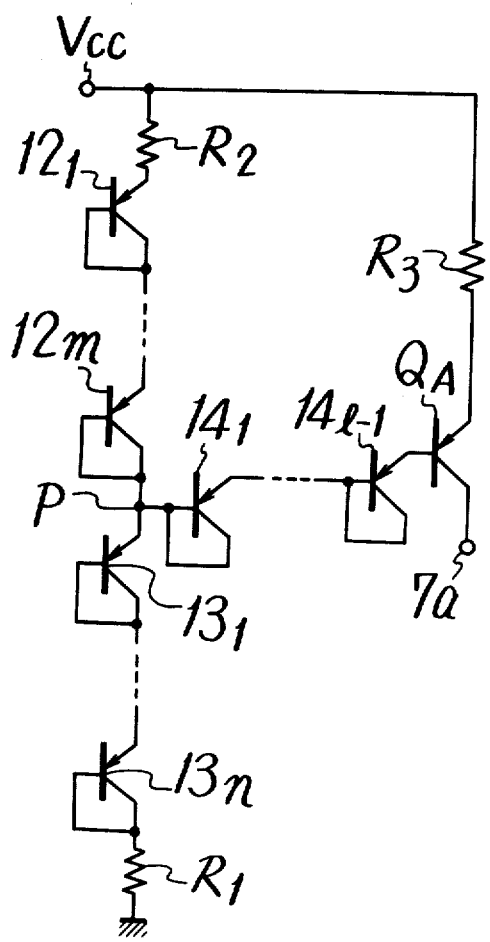

In the constant current sources shown in FIGS. 2 and 4, the constant current $I_R$ is proportional to $(V_{CC}-V_{BE})$. In this case, when the source voltage $V_{CC}$ is small, the value of $V_{BE}$ is not negligible. Since the value of $(V_{CC}-V_{BE})$ is changed according to temperature, the current $I_R$ is also changed according to temperature and hence these circuits can not always be defined as the constant current source having good characteristics. Therefore, if temperature characteristics are more seriously taken into consideration, a constant current circuit as shown in FIG. 5 should be considered. In the circuit of FIG. 5, the voltage source terminal $V_{CC}$ is connected through the resistor $R_2$ to one end of a series circuit of m number of diode-connected pnp-type transistors $12_1, \ldots 12_m$, while the other end of this series circuit is connected to one end of a series circuit of n number of diode-connected pnp-type transistors $13_1, \ldots, 13_n$. The other end of the series circuit of transistors $13_1, \ldots 13_n$ is then grounded through the resistor $R_1$. The connection point P between the above two series circuits is connected through a series circuit of $(l-1)$ number of diode-connected pnp-type transistors $14_1, \ldots, 14_{l-1}$ to the base of pnp-type transistor $Q_A$, while the emitter of transistor $Q_A$ is connected through the resistor $R_3$ to the voltage source terminal $V_{CC}$ and the collector thereof is connected to the output terminal $7a$. In the circuit of FIG. 5, a potential $V_P$ at the point P is expressed as follows:

$$V_P = \frac{R_1}{R_1 + R_2}[V_{CC} - (m + n)V_{BE}] + nV_{BE}$$

The emitter potential $V_E$ of transistor $Q_A$ is given as follows:

$$V_E = V_P + lV_{BE}$$

Thus, the constant current $I_R$ becomes as follows:

$$I_R \approx \frac{V_{CC} - V_E}{R_3} = \frac{V_{CC} - V_P - lV_{BE}}{R_3}$$

$$= \frac{1}{R_3} \cdot \frac{1}{R_1 + R_2}\{R_2 V_{CC} +$$

$$[(m - l)(R_1 + R_2) - R_2(n + m)]V_{BE}\}$$

If it is assumed as follows:

$$(m-l)(R_1+R_2) = R_2(n+m)$$

the following equation is obtained:

$$I_R = \frac{R_2}{R_3} \cdot \frac{1}{R_1 + R_2} V_{CC}$$

Accordingly, the constant current $I_R$ becomes independent of $V_{BE}$ and hence a constant current source with good temperature characteristics can be obtained.

In this case, if $l=n=1$ and $m=2$ be assumed, the following result is obtained:

$$(2 - 1)(R_1 + R_2) = R_2(1 + 2) \therefore R_1 = 2R_2$$

Figure 6:
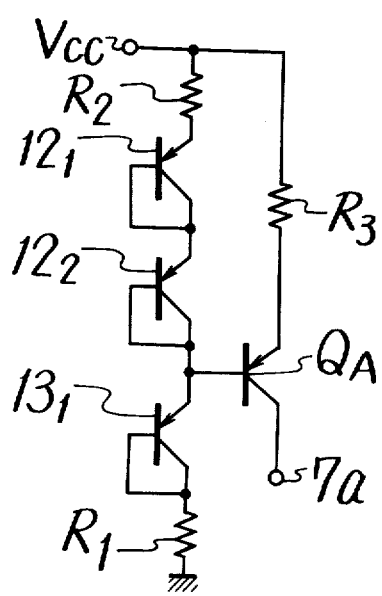

A practical example therefor will have a construction as shown in FIG. 6. Accordingly, in the circuit of FIG. 6, the constant current $I_R$ is expressed as follows:

$$I_R = \frac{R_2}{R_3} \cdot \frac{1}{R_1 + R_2} V_{CC}$$

$$= \frac{R_2}{R_3} \cdot \frac{1}{2R_2 + R_2} V_{CC} = \frac{V_{CC}}{3R_3}$$

Figure 7:
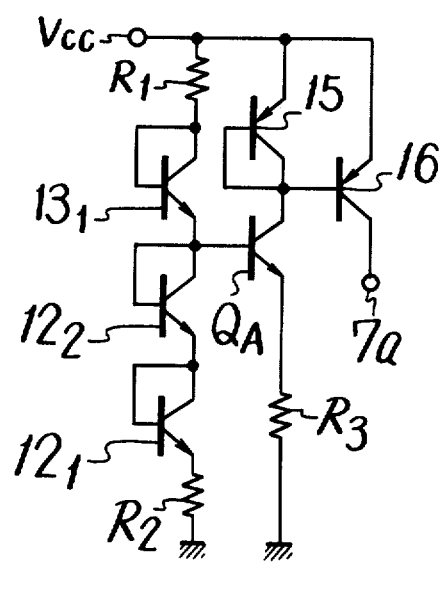

Thus, a constant current source with good temperature characteristics can be obtained. As a practical application of the circuit of FIG. 6, there is considered a circuit as shown in FIG. 7. In the circuit of FIG. 7, the transistors $12_1$, $12_2$, $13_1$ and $Q_4$ of FIG. 6 are respectively replaced by npn-transistors. Further, the collector of transistor $Q_4$ is connected to the collector-base connecting point of a pnp-type transistor 15 and also to the base of a pnp-type transistor 16. While the emitters of transistors 15 and 16 are respectively connected to the voltage source terminal $V_{CC}$ and the collector of transistor 16 is connected to the output terminal 7a. Similarly, in this circuit of FIG. 7, there can be produced a constant current with good temperature characteristics.

Figure 8:
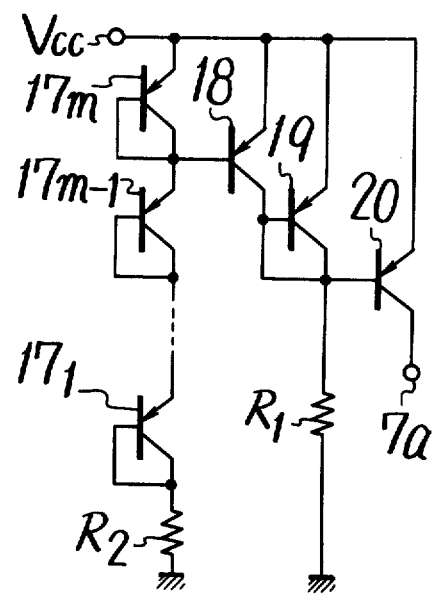

As another example of the constant current source with good temperature characteristics, there is also considered a circuit such as shown in FIG. 8. In this circuit, the voltage source terminal $V_{CC}$ is grounded through a series circuit of m number of diode-connected pnp-type transistors $17_1, \ldots 17_m$ and the resistor $R_2$. The collector-base connecting point of the transistor $17_m$, which is the nearest to the voltage source terminal $V_{CC}$ in the transistors $17_1, \ldots, 17_m$, is connected to the base of a pnp-type transistor 18. Further, the emitter of transistor 18 is connected to the voltage source terminal $V_{CC}$, and thus a current mirror circuit is formed by these transistors 18 and $17_m$. The collector of transistor 18 is also connected to the collector-base connecting point of a diode-connected pnp-type transistor 19 which is in turn connected at its emitter to the voltage source terminal $V_{CC}$. The collector-base connecting point of transistor 19 is grounded through the resistor $R_1$ and also connected to the base of a pnp-type transistor 20 which is then connected at its emitter to the voltage source terminal $V_{CC}$ and at its collector to the output terminal 7a. In this case, a current mirror circuit is formed by these transistors 19 and 20. Now, let it be assumed that these transistors $17_1, \ldots, 17_m$, 18, 19 and 20 have the same characteristics. Further, if a current flowing through the transistor 18 is taken as $I_1$, a current flowing through the transistor 19 as $I_2$, a current flowing through the resistor $R_1$ as $I_3$ and the base current of each transistor is neglected, the following relations are given:

$$I_1 = \frac{V_{CC} - mV_{BE}}{R_2}$$

$$I_1 + I_2 = I_3$$

$$I_3 = \frac{V_{CC} - V_{BE}}{R_1}$$

$$I_R = I_2$$

Accordingly, the constant current $I_R$ is expressed as follows:

$$I_R = I_2 = I_3 - I_1 = \frac{V_{CC} - V_{BE}}{R_1} - \frac{V_{CC} - mV_{BE}}{R_2}$$

$$= \left(\frac{1}{R_1} - \frac{1}{R_2}\right) V_{CC} + \left(\frac{m}{R_2} - \frac{1}{R_1}\right) V_{BE}$$

Assuming $R_2 = mR_1$, the following equation is obtained:

$$I_R = I_2 = \frac{m-1}{m} \cdot \frac{V_{CC}}{R_1}$$

Figure 9:
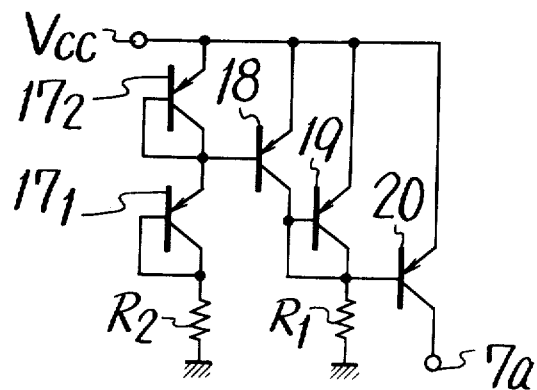

From the above relation, it is noted that the current $I_R$ is independent of $V_{BE}$, and hence there can be obtained a constant current circuit with good temperature characteristics. If assumed $m=2$ in the above example, a circuit as shown in FIG. 9 can be formed. The constant current $I_R$ in the circuit of FIG. 9 becomes $I_R = (V_{CC}/2R_1)$ and hence there can also be obtained a constant current circuit with good temperature characteristics.

These constant current sources as shown in FIGS. 3 through 9 can be selectively used as occasion demands. In order to obtain the opposite direction of the output current $I_R$ in the above circuits, the conductivity of used transistors may be reversed. The circuits shown in FIGS. 3 through 9 can also be basically used as the input signal current source 1 of the circuit of FIG. 1. In this case, a constant current may be made changeable according to input signals. It is needless to say that those shown in FIGS. 3 to 9 can be similarly applied to constant current sources which will be described below.

Figure 10:
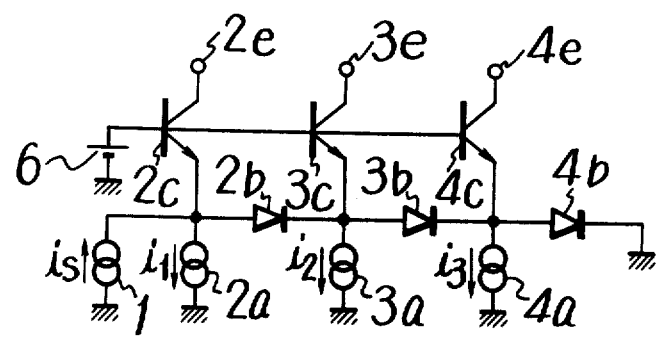
FIGS. 10, 11, 12 and 14 are connection diagrams showing other embodiments of this invention.
Figure 11:
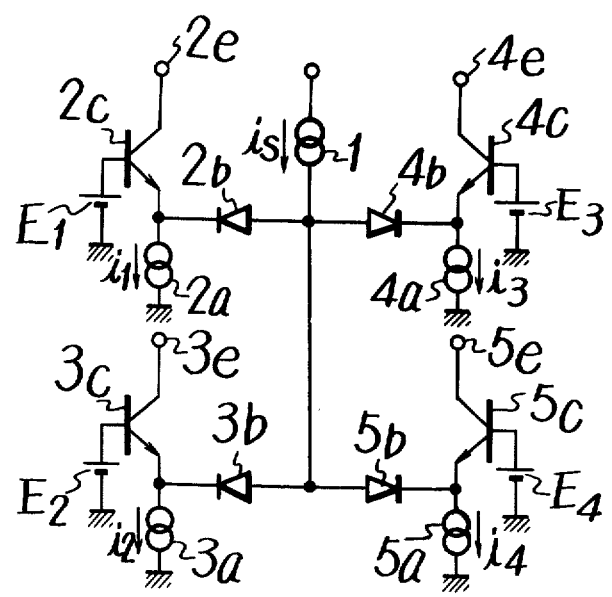

If the basic circuit of FIG. 1 is modified in circuit arrangements as shown in FIGS. 10 and 11, detected currents can be easily obtained. By way of example, three reference constant current sources 2a, 3a and 4a are used in the circuit of FIG. 10 and four reference constant current sources 2a, 3a, 4a and 5a are used in the circuit of FIG. 11. In any way, the number of this reference constant current source is preferred to be two or more. In the circuits of FIGS. 10 and 11, elements corresponding to those in FIG. 1 will be shown by the same reference numerals.

In the circuit of FIG. 10, the connection point between constant current source 2a and diode 2b, the connection point between constant current source 3a and diode 3b, and the connection point between constant current source 4a and diode 4b are respectively connected to the emitters of transistors 2c, 3c and 4c, which are applied at each base thereof with a predetermined bias voltage from a battery 6. The other portions of FIG. 10 are formed in the same manner as those in FIG. 1.

In this circuit of FIG. 10, when the input signal current $i_S$ is zero, the constant current $i_1$ is supplied through the transistor 2c, the constant current $i_2$ is supplied through the transistor 3c, and the constant current $i_3$ is supplied through the transistor 4c so that these transistors are turned ON, respectively. When the input signal current $i_S$ is $0 < i_S < i_1$, the transistors 2c, 3c and 4c still keep in their ON-state except that the current flowing through the transistor 2c becomes $(i_1 - i_S)$.

When the input signal current $i_S$ satisfies the relation of $i_1 \leq i_S < (i_1 + i_2)$, the constant current $i_1$ of the constant current source 2a is all fed from $i_S$ and a current of $(i_S - i_1)$ flows into the constant current source 3a through the diode 2b. Accordingly, the transistor 2c is turned off and a current flowing through the transistor 3c becomes $(i_1 + i_2 - i_S)$. In this case, the transistor 4c keeps the current $i_3$ flowing therethrough. That is, when the transistor 2c is turned OFF from its ON state, it can be noticed that the input signal current $i_S$ has exceeded the reference current $i_1$.

When the input signal $i_S$ satisfied the relation of $(i_1 + i_2) \leq i_S < (i_1 + i_2 + i_3)$, a current of $(i_S - i_1 - i_2)$ similarly flows through the diode 3b into the constant current source 4a. That is, the transistor 3c is turned OFF from its ON state thereby to reveal that the input signal current $i_S$ has exceeded $(i_1 + i_2)$. Similarly, when the input signal current $i_S$ exceeds $(i_1 + i_2 + i_3)$, all of the transistors 2c, 3c and 4c are turned OFF. It will be easily understood that the circuit of FIG. 10 has the same working effect as that of FIG. 1.

In the circuit of FIG. 11, the input signal current source 1 is grounded through a series circuit of diode 2b and constant current source 2a, a series circuit of diode 3b and constant current source 3a, a series circuit of diode 4b and constant current source 4a, and a series circuit of diode 5b and constant current source 5a, respectively. The connection point between diode 2b and constant current source 2a is connected to the emitter of npn-type transistor 2c. Similarly, the connection point between diode 3b and constant current source 3a, the connection point between diode 4b and constant current source 4a, and the connection point between diode 5b and constant current sources 5a are respectively connected to the emitters of respective npn-type transistors 3c, 4c and 5c. The bases of transistors 2c, 3c, 4c and 5c are applied with positive DC biasing voltages $E_1$, $E_2$, $E_3$ and $E_4$. In this case, the values of these voltages are selected to have a little difference from each other in a relation of $E_1 < E_2 < E_3 < E_4$. Further, when $i_S = 0$, the constant currents $i_1$, $i_2$, $i_3$ and $i_4$ flow through the transistors 2c, 3c, 4c and 5c to make them conductive. When $0 < i_S < i_1$, this current $i_S$ is all supplied through the diode 2b to the constant current source 2a with the result that the output current of transistor 2c becomes $(i_1 - i_S)$ but the transistor 2c keeps its ON state. Next, when the input signal current is $i_1 \leq i_S < (i_1 + i_2)$, the current $i_1$ is supplied by the current $i_S$ so that the transistor 2c is turned OFF and the difference current $(i_S - i_1)$ flows through the diode 3b to the constant current source 3a. Accordingly, a current flowing through the transistor 3c becomes $(i_1 + i_2 - i_S)$, but the transistor 2c is changed from ON state to OFF state to reveal that the input signal current $i_S$ has exceeded the reference constant current $i_1$. In a similar and sequential manner, the transistor 3c is turned OFF to disclose that the input signal current $i_S$ has exceeded $(i_1 + i_2)$, the transistor 4c is turned OFF to reveal that the input signal current $i_S$ has exceeded $(i_1 + i_2 + i_3)$, and the transistor 5c is turned OFF to suggest that the input signal current $i_S$ has exceeded $(i_1 + i_2 + i_3 + i_4)$. Of course, the circuit of FIG. 11 has the same working effect as that of FIG. 1.

Figure 12:
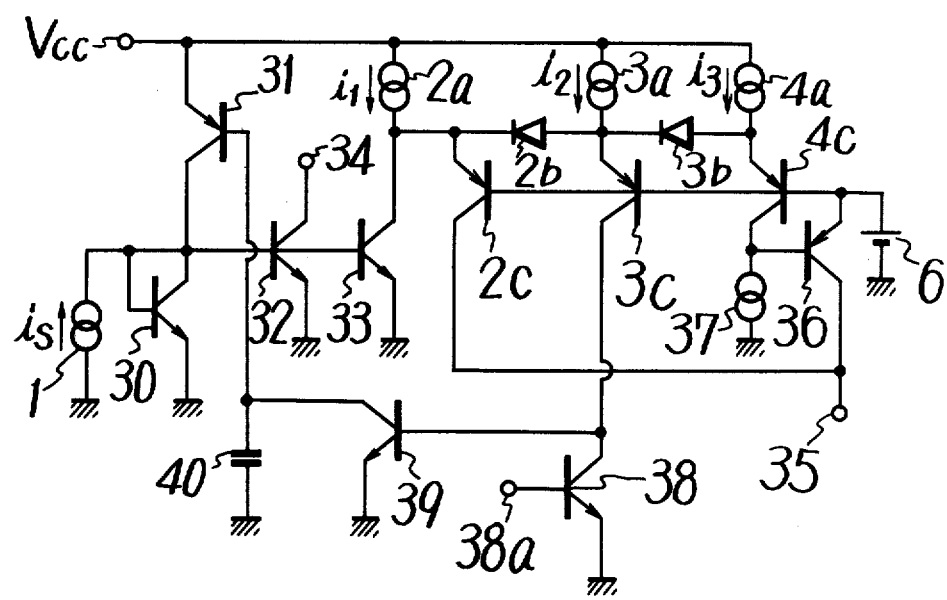
Figure 13A:
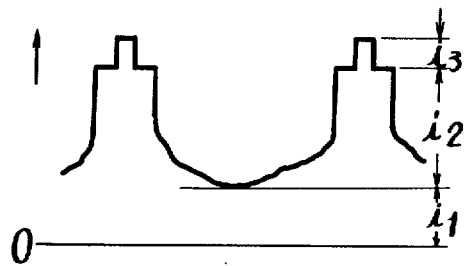
FIGS. 13A and 13B are waveform diagrams used for explaining this invention.
Figure 13B:
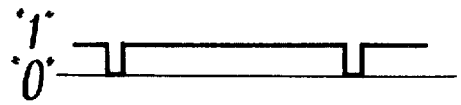

FIG. 12 shows an example wherein this invention is applied to an automatic gain control (AGC) circuit for a luminance signal of a video tape recorder or the like. In the circuit of FIG. 12, as the input signal current source 1 there is used a luminance signal as shown in FIG. 13A. The input signal current source 1 is connected at its one end to the ground and at its other end to the base-collector connecting point of a diode-connected npn-type transistor 30 which is then grounded at its emitter. The other end of input signal current source 1 is also connected to the collector of a pnp-type transistor 31 the emitter of which is connected to the voltage source terminal $V_{CC}$ to which a positive DC voltage is supplied. The other end of input signal current source 1 is further connected to the bases of npn-type transistors 32 and 33. The emitters of these transistors 32 and 33 are respectively grounded and the collector of transistor 32 is connected to a luminance signal output terminal 34. While the collector of transistor 33 is connected through the constant current source 2a of current $i_1$ to the voltage source terminal $V_{CC}$ and also connected to the cathode of diode 2b. The anode of diode 2b is then connected through the constant current source 3a of current $i_2$ to the voltage source terminal $V_{CC}$ and also connected to the cathode of diode 3b. Further, the anode of diode 3b is connected through the constant current source 4a of current $i_3$ to the voltage source terminal $V_{CC}$. In this case, values of the currents $i_1$, $i_2$ and $i_3$ are respectively selected as shown in FIG. 13A. In other words, $i_1$ is selected as a current corresponding to the established white peak level of a negative modulated luminance signal, $i_2$ is selected as a current between the pedestal level and the established white peak level, and $i_3$ is selected as a current correspondiang to the level of a synchronizing signal. The connection point between constant current source 2a and diode 2b, the connection point between diode 3b and constant current source 3a, and the connection point between diode 3b and constant current source 4a are respectively connected to the emitters of pnp-type transistors 2c, 3c and 4c. The respective bases of transistors 2c, 3c and 4c are grounded through a biasing battery 6. The collector of transistor 2c is connected to an AGC signal output terminal 35, while the collector of transistor 4c is connected to the base of a pnp-type transistor 36 and also grounded through a constant current source 37 of a minute current. Further, the emitter of transistor 36 is connected to the positive electrode of the battery 6 and the collector thereof is connected to the AGC signal output terminal 25. The transistor 3c is connected at its collector to the collector of an npn-type transistor 38. The emitter of transistor 38 is grounded and the base thereof is connected to a control signal input terminal 38a to which is supplied a control signal as shown in FIG. 13B so that the transistor 38 is turned off only during a period corresponding to the front porch at the pedestal portion of the video signal. The collector of transistor 38 is also connected to the base of an npn-type transistor 39, the emitter of which is grounded. The collector of transistor 39 is connected to the base of transistor 31 and also grounded through a capacitor 40.

With the circuit arrangement shown in FIG. 12, when the luminance signal $i_S$ is $i_1 \leq i_S < (i_1 + i_2)$, the collector current of transistor 32 is supplied by $i_S$ and the collector current of transistor 33 is supplied by the currents $i_1$ and $i_2$, and since the transistor 38 is normally ON, a current $(i_1+i_2-i_S)$ flows through the transistors 3c and 38. At this time, the transistors 39 and 31 are respectively OFF due to the ON state of the transistor 38. When the transistor 38 is turned OFF during the period corresponding to the front porch of the pedestal level, the transistors 39 and 31 are turned ON and a current is supplied through the transistors 3c, 39 and 31 to the bases of transistors 32 and 33. As a result, the collector currents of transistors 32 and 33 increase and a current flowing from the constant current source 3a to the collector of transistor 33 increases so that a current flowing through the transistor 3c is decreased. That is, the transistors 3c, 39 and 31 form a negative feedback circuit and the collector currents of transistors 32 and 33 are clamped to $(i_1+i_2)$ during the pedestal period. When the input signal current $i_S$ exceeds $(i_1+i_2+i_3)$ at the synchronizing signal portion, the transistor 4c is turned OFF to make the transistor 36 conductive so that an AGC signal is obtained at the output terminal 35. This AGC signal is fed back to the luminance signal amplifier and, as a result, the amplitude of the luminance signal is lowered to control the transistors 32 and 33 so as to have the same collector current of $(i_1+i_2+i_3)$. However, since the pedestal level is clamped to $(i_1+i_2)$, if the level of the horizontal synchronizing signal is suppressed to $i_3$ the peak value or maximum level of the video signal will be clamped to $(i_1+i_2+i_3)$. When the input signal current $i_S$ becomes lower than the level of $i_1$ at the white peak, the transistor 2c is turned ON to produce the AGC signal which is fed back through the output terminal 35 to the luminance signal amplifier to control the same so that the amplitude of the luminance signal is lowered and the level of the white peak becomes $i_1$.

Figure 14:
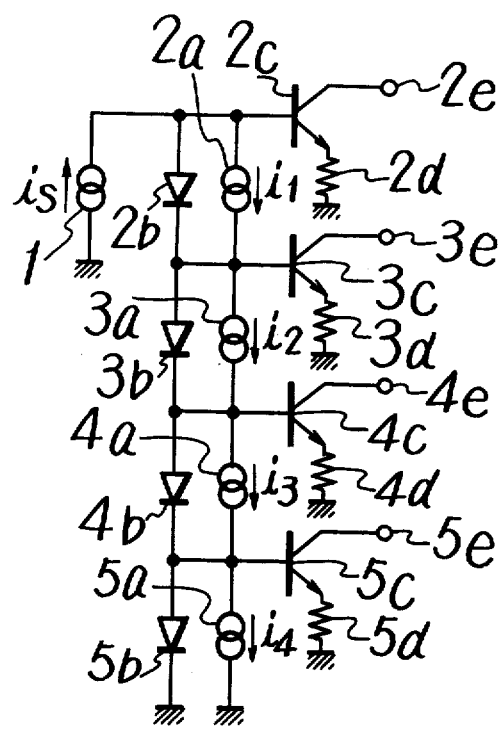

FIG. 14 shows a further embodiment of this invention. In the circuit of FIG. 14, elements corresponding to those of FIG. 1 are shown by the same reference numerals with their description being omitted. In this circuit of FIG. 14, one end of the input signal current source 1 is grounded. The other end of the current source 1 is also grounded through a series connection consisting of a parallel circuit of constant current source 2a of current $i_1$ and diode 2b, a parallel circuit of constant current source 3a of current $i_2$ and diode 3b, parallel circuit of constant current source 4a of current $i_3$ and diode 4b, and a parallel circuit of constant current source 5a of current $i_4$ and diode 5b. These diodes 2b, 3b, 4b and 5b are respectively connected at their anode sides to the bases of npn-type transistors 2c, 3c, 4c and 5c which are grounded at their emitters through resistors 2d, 3d, 4d and 5d and connected at their collectors to output terminals 2e, 3e, 4e and 5e, respectively. In this case, the current $i_1$, $i_2$, $i_3$ and $i_4$ are selected in value so as to satisfy a relation of $i_1<i_2<i_3<i_4$. Now, when the input signal current $i_S$ is smaller than $i_1$, the current $i_S$ flows through series-connected constant current sources 2a, 3a, 4a and 5a to the ground and the diodes 2b, 3b, 4b and 5b become OFF. At this time, since only the input signal current $i_S$ flows through the constant current sources 2a, 3a, 4a and 5a, voltages across the respective diodes 2b, 3b, 4b and 5b become zero. Thus, the respective base potentials of transistors 2c, 3c, 4c and 5c become zero thereby to make all of them OFF.

When the input signal current $i_S$ is $i_1<i_S<i_2$, a current of $(i_S-i_1)$ flows through diode 2b and the other diodes 3b, 4b and 5b are kept OFF. As a result, the base potential of transistor 2c becomes $V_D$ to make it ON. However, the base potentials of other transistors 3c, 4c and 5c are kept zero so that they ar all OFF. In other words, turning-ON of transistor 2c gives a notice that the input signal current $i_S$ has exceeded $i_1$.

When $i_2<i_S<i_3$, the current of $(i_S-i_1)$ flows through diode 2b and a current of $(i_S-i_2)$ flows through diode 3b, so that the base potential of transistor 2c becomes $2V_D$ and that of transistor 3c becomes $V_D$ to make both transistors ON, but the transistors 4c and 5c are still OFF. Thus, these transistors 2c and 3c are turned ON to reveal that the input signal current $i_S$ has exceeded $i_2$.

Similarly, when $i_3<i_S<i_4$, the transistors 2c, 3c and 4c are turned ON, and when $i_4<i_S$, the transistors 2c, 3c, 4c and 5c are turned ON so that it can be noticed that $i_S$ has exceeded $i_3$ or $i_4$. It is, of course, that the working effect of the circuit of FIG. 14 is the same as that of FIG. 1.

In the circuit of FIG. 14, when diodes are all non-conductive, a series connection of constant current sources will be equivalently inserted therein. In this case, when a constant current $I_{R1}$ of one constant current source is smaller than a constant current $I_{R2}$ of other constant current source, there may occur a simple question as to where the difference current flows. A detailed consideration will be given below to the aforesaid question.

Figure 15:
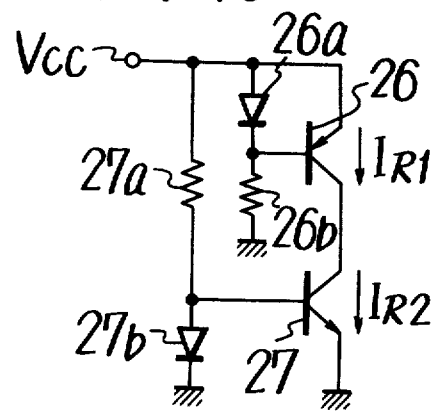
FIG. 15 is a connection diagram used for explaining this invention.

As a simple circuit example wherein two constant current sources are connected in series across the voltage source, where is considered a circuit as shown in FIG. 15. In this circuit of FIG. 15, the voltage source terminal $V_{CC}$ is grounded through a series circuit of diode 26a and resistor 26b. The connection point between diode 26a and resistor 26b is connected to the base of a pnp-type transistor 26 whose emitter is connected to the voltage source terminal $V_{CC}$ to form a first constant current source. Further, the voltage source terminal $V_{CC}$ is grounded through a series circuit of resistor 27a and diode 27b, and the connection point therebetween is connected to the base of an npn-type transistor 27 whose emitter is grounded to form a second constant current source. The collectors of transistors 26 and 27 are interconnected.

A first consideration will be taken on a case where the current $I_{R1}$ of the first constant current source is smaller than the current $I_{R2}$ of the second constant current source. In this case, since the collector-emitter voltage $V_{CE}$ of transistor 27 will have been reduced, the transistor 27 will be driven into its saturated region. As a result, $I_{R2}$ is decreased and balanced at $I_{R1}=I_{R2}$. In other words, the current value of the constant curent source consisting of transistor 27 is subjected to change. Next, when the current $I_{R1}$ is larger than the current $I_{R2}$, the collector potential of transistor 27 increases toward the positive DC voltage $V_{CC}$ so that the transistor 26 will be driven into its saturated region. Finally, the current $I_{R1}$ is decreased and balanced at $I_{R2}=I_{R1}$. In other words, the current value os the constant current source consisting of transistor 26 is subjected to change so as to be automatically balanced. That is, the constant current source mentioned in this invention means a circuit forming a constant current by transistors and is not a circuit supplying a constant current under any available conditions.

In this invention, the number of the pair of constant current source and diode should be two or more. Further, in the above-mentioned embodiments, the transistors 2c, 3c, 4c and 5c can be, of course, replaced by any other switching elements or detecting elements.

It will be apparent that a number of changes and variations can be effected without departing from the scope of the novel concepts of this invention.

I claim as my invention:

1. A current comparator circuit comprising an input signal current source, a first reference current source with one side connected to a reference potential and its second side connected to said input current source, a first diode with its first side connected to the second side of said first reference current source, a second reference current source with a first side connected to a reference potential, a second diode with a first side connected to the second sides of said first diode and the second side of said second reference current source, the second side of said second diode coupled to reference potential, a first comparator output circuit including a first switching transistor with a control electrode, a second electrode and a third electrode with the control electrode connected to said input signal current source and to the first side of said first diode, an output terminal connected to said second electrode, said third electrode coupled to reference potential, a second transistor with a control electrode, a second electrode and a third electrode with said control electrode connected to the first side of said second diode, a second output terminal connected to said second electrode and said third electrode coupled to reference potential.

2. A current comparator according to claim 1, wherein said first constant current source comprises third and fourth transistors with their bases connected together, second electrodes of each of said third and fourth transistors connected together, the third electrode of said third transistor connected to the bases of said third and fourth transistors, a first resistor connected between said third electrode of said third transistor and reference potential.

3. A current comparator circuit comprising, an input current source with one side connected to a reference potential, a first constant current source with one side connected to said reference potential and the second side connected to the second side of said input current source, a first diode with one side connected to said second side of said first constant current source, a second constant current source with one side connected to reference potential and the second side connected to the second side of said first diode, a second diode with its first side connected to the second side of said second constant current source and its second side coupled to said reference potential, a first transistor with first, second and third electrodes with its first electrode connected to said one side of said first diode, a first load connected between the second electrode of said first transistor and said reference potential, a first output terminal connected to the third electrode of said first transistor, a second transistor with first, second and third electrodes with the first electrode connected to said one side of said second diode, a second load connected between the second electrode of said second transistor and said reference potential, and a second output terminal connected to a third electrode of said second transistor.

4. A current comparator circuit comprising an input signal current source, a first transistor with first, second and third electrodes with said first electrode connected to said input signal source, a first diode with a first side connected to said first electrode of said first transistor, a first constant current source with a first side connected to said first electrode of said first transistor, a first output terminal connected to said second electrode of said first transistor, said third electrode of said first transistor coupled to a reference potential, a second transistor with first, second and third electrodes with said first electrode connected to second sides of said first diode and said first constant current source, a second diode with a first side connected to said first electrode of said second transistor, a second constant current source with a first side connected to said first side of said second diode, the second sides of said second diode and said second constant current source coupled to a reference potential, a second output terminal connected to said second electrode of said second transistor, and the third electrode of said second electrode coupled to a reference potential.

5. A current comparator circuit comprising an input signal current source, a first diode with a first side connected to said input current source, a first constant current source with a first side connected to the second side of said first diode and a second side connected to a reference potential, a first transistor with first, second and third electrodes with the first electrode connected to the second side of said first diode, a first output terminal connected to the second electrode of said first transistor, and a first biasing source connected to the third electrode of said first transistor, a second diode with a first side connected to said input signal source, a second constant current source with a first side connected to the second side of said second diode and a second side connected to a reference potential, a second transistor with first, second and third electrodes with the first electrode connected to the second side of said second diode, a second output terminal connected to the second electrode of said second transistor and a second biasing source connected to the third electrode of said second transistor.

* * * * *